United States Patent [19]

Sakamoto et al.

[11] 3,737,804

[45] June 5, 1973

[54] INJECTION-TYPE FREQUENCY-LOCKED AMPLIFIER

[75] Inventors: Kazuo Sakamoto; Ryoji Tamura, both of Tokyo, Japan

[73] Assignee: Nippon Electric Company, Limited, Tokyo, Japan

[22] Filed: June 12, 1972

[21] Appl. No.: 261,758

[30] Foreign Application Priority Data

June 15, 1971 Japan ................................46/42771

[52] U.S. Cl. .............331/107 R, 331/96, 331/107 G, 331/117 D, 333/33

[51] Int. Cl. ..............................................H03b 7/14

[58] Field of Search ......................331/107 R, 107 G, 331/107 T, 96, 101, 117 D; 333/33, 22

[56] References Cited

UNITED STATES PATENTS

| | | | |
|---|---|---|---|
| 2,512,980 | 6/1950 | Sunstein | 333/33 |
| 3,426,295 | 2/1969 | De Loach, Jr. et al. | 331/107 |
| 3,510,800 | 5/1970 | Kaneko et al. | 331/107 G |
| 3,534,293 | 10/1970 | Harkless | 331/107 |
| 3,701,050 | 10/1972 | Mizuno | 331/107 R |

*Primary Examiner*—John Kominski
*Attorney*—Richard C. Sughrue, Gideon Franklin Rothwell, John H. Mion et al.

[57] ABSTRACT

An injection-type frequency-locked amplifier having separate input and output terminals as opposed to a single input/output terminal. The input impedance of the amplifier is selected such that a portion of the input signal is reflected whereby the reflected input signal cancels the output signal appearing at the input terminal. The output terminal is impedance matched independent of the input terminal.

12 Claims, 4 Drawing Figures

PRIOR ART

INJECTION-TYPE FREQUENCY-LOCKED AMPLIFIER

BACKGROUND OF THE INVENTION

The present invention relates to an injection-type frequency-locked amplifier employing an injection-type frequency-locked oscillator.

In the injection-type frequency-locked amplifier, the oscillator, oscillating at a given frequency, is supplied with an input signal having a frequency close to the oscillation frequency. In response to the input signal, the oscillation frequency assumes the frequency of the input signal and is locked thereto.

In the conventional injection-type frequency locked amplifier, the oscillator has a single, common input-/output terminal. In other words, the input/output terminal of the oscillator receives both input and output signals. As a result, a circulator is needed to separate the input signals from the output signals.

This type of amplifier gives rise to various problems. For example, the circulator causes insertion losses on the input and output signals. In addition, when the input signal level gradually increases, the operating point of the oscillator deviates in proportion to the input signal, thereby changing the once matched output impedance of the oscillator, resulting in an impedance mismatch. As a result of the impedance change, the reflected portion of the input signal resulting from impedance mismatch and the oscillator output signal frequency locked to the input signal, tend to cancel each other at the center frequency of injection locked oscillation. This is due to the fact that these signals are approximately 180° out of phase with respect to each other. Thus, the output signal level decreases as the level of the input signal increases. To compensate for this loss in output signal level, it is necessary to readjust the output circuit of the oscillator in response to the input signal level to ensure an impedance match. Practically, however, impedance matching can hardly be achieved, since the output terminal of the oscillator is used in common as the input and output terminal receiving both input and output signals.

SUMMARY OF THE INVENTION

In view of the foregoing, an object of this invention is to provide an injection-type frequency-locked amplifier comprising an oscillator, in which the insertion losses are eliminated by dispensing with the circulator.

Another object of this invention is to provide an injection-type frequency-locked amplifier in which the attenuation of the output signal, resulting from the cancelling effect of the reflected portion of the input signal on the output signal, is eliminated.

Still another object of this invention is to provide an injection-type frequency-locked amplifier in which impedance matching of the output terminal can be achieved independent of the impedance matching of the input terminal. This is accomplished by separating the input terminal from the output terminal.

A further object of this invention is to provide an injection-type frequency-locked amplifier of a simple construction and which does not utilize a circulator.

According to the present invention, there is provided an injection-type frequency-locked amplifier which includes an oscillator having separate input and output terminals. The input signal is applied to the input terminal in the same manner it is applied to the common input/output terminal of injection-type frequency-locked amplifier. An output signal, locked to the input signal frequency, appears at the input terminal of the oscillator as in the case of the single-terminal device. This output signal does not contribute to the output of the amplifier but rather causes a loss in the output. However, the device of this invention is capable of avoiding such a loss based on the following principle. The impedance at the input terminal is predetermined so that the reflected portion of the input signal and the output signal locked to the input signal frequency cancel each other at the center frequency of injection locked oscillation. In other words, the phase of the reflected portion of the input signal is made to be at approximately 180° with respect to the output signal. The level of the input signal is selected such that the reflected portion of the input signal and the output signal perfectly cancel each other. Under this condition, no output signal appears at the input terminal of the oscillator, i.e., the input terminal of the injection-type frequency-locked amplifier. The output signal of the amplifier is derived from the output terminal of the oscillator without any loss.

BRIEF DESCRIPTION OF THE DRAWINGS

Other objects, features and advantages of the invention will become more apparent from the following description taken in conjunction with the accompanying drawings, wherein.

DETAILED DESCRIPTION OF THE PREFERRED EMBODIMENTS

Figures 1, 2, 3, 4:
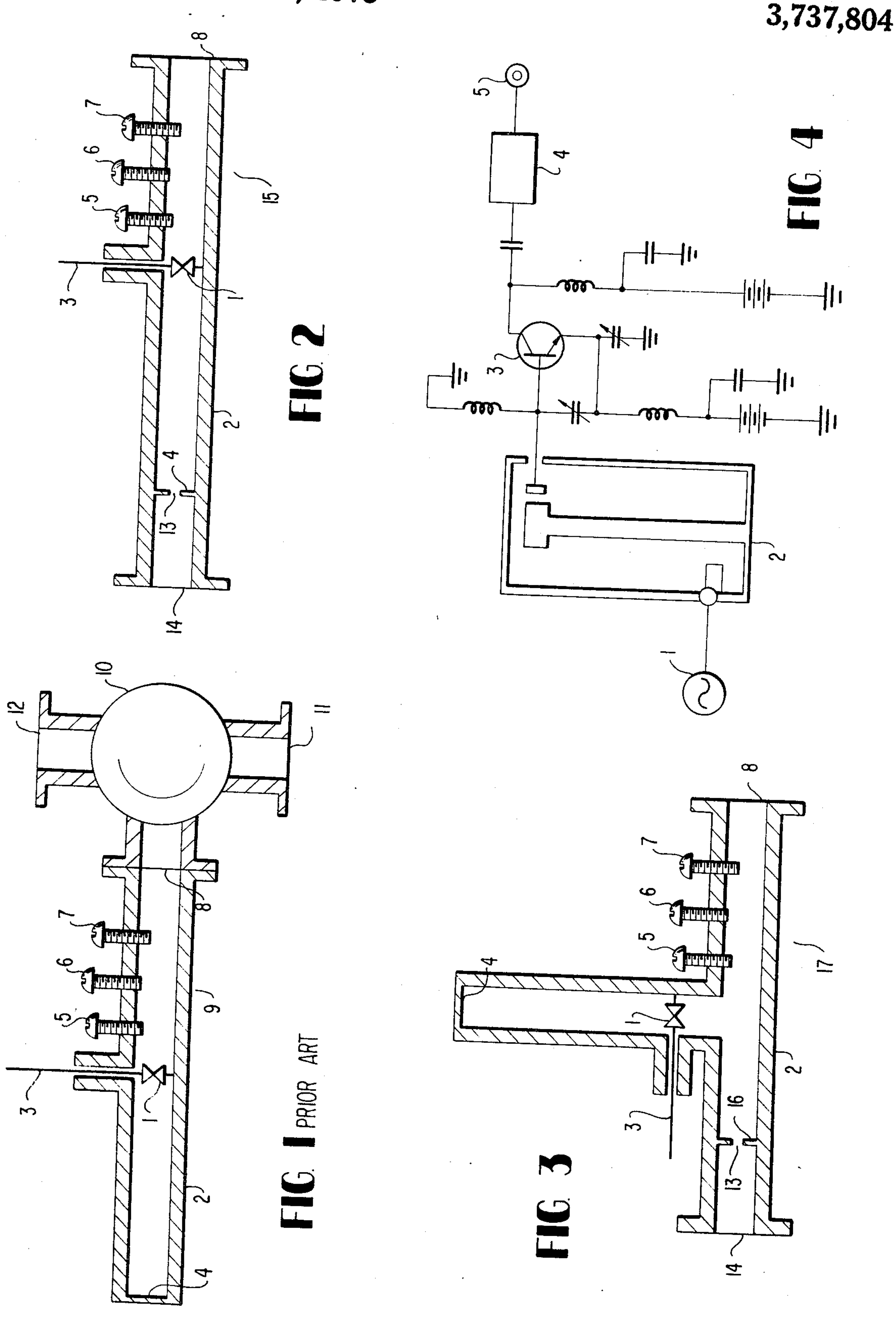
FIG. 1 PRIOR ART, FIG. 2, FIG. 3, FIG. 4
FIG. 1 is a diagram showing an example of a conventional injection-type frequency-locked amplifier.
FIG. 2 diagrammatically shows an embodiment of the invention.
FIG. 3 diagrammatically shows another embodiment of the invention.
FIG. 4 is a diagram showing still another embodiment of the invention.

Referring to FIG. 1, the conventional injection-type frequency-locked amplifier is composed of a waveguide circuit 2 in which a Gunn diode 1 is disposed as an oscillator element. A bias voltage is applied to the diode through a lead wire 3. Adjusting screws 5, 6 and 7 mounted on the waveguide 2 are for establishing an impedance match at the output. An output signal is derived from the input/output terminal 8. These elements taken together constitute what is termed an oscillator 9, whose oscillation frequency depends substantially on the distance from the Gunn diode 1 to the short-circuit face 4 of the waveguide 2. A circulator 10 is provided at the input/output terminal 8, to complete the injection-type frequency-locked amplifier. The input signal is supplied from the circulator input terminal 11 to the amplifier input/output terminal 8 by way of the circulator 10. The frequency of the oscillator 9 output signal is locked to the frequency of the input signal. This output signal, appearing at the input/output terminal 8, appears at the output terminal 12 of the circulator 10. With this configuration, the circulator 10 is indispensable in order to separate the output signal from the input signal. However, the circulator causes insertion losses on both the input and output signals. Furthermore, when the input signal level is raised gradually, the operating point of the Gunn diode 1 is caused to deviate in proportion to the variation of the input signal and the output impedance once matched by means of adjust screws 5,6 and 7 deviates accordingly, resulting in a mismatched state at the input/output terminal 8. Under this condition, the reflected portion of the input signal and the output signal which is frequency locked to the input signal tend to differ in phase by approximately 180° at the center frequency. This causes the reflected input signal to tend to cancel the output signal, and consequently there is a great attenuation of the oscillator output. To compensate for this decrease in the output signal level, readjustment of screws 5,6 and 7 is needed to re-establish an impedance match. Whereas, the adjusting screws 5,6 and 7 effect not only the output signal but also the input signal, it is difficult to establish the desired impedance-match with respect to both the input and output signals.

In the embodiment of the invention shown in FIG. 2, an oscillator comprising a Gunn diode (an oscillator element) 1 is disposed in the waveguide 2 as in the structure shown in FIG. 1. Like components in FIGS. 1 and 2 are indicated by like numerals.

The oscillator 15 used in this device is substantially the same as oscillator 9 shown in FIG. 1, except that an input terminal 14 is provided in addition to the input/output terminal 8 by disposing a coupling window 13 in the short-circuit face 4. Looking into the oscillator 15 from its input terminal 14, an injection-type frequency-locked oscillation can be obtained by applying an input signal to the input terminal 14 as in the device shown in FIG. 1 in which an input signal is applied to the input/output terminal 8. In this construction, the oscillator 15 output signal, locked to the input signal, also appears at the input terminal 14. This output signal does not contribute to the output of the amplifier and comes out as a loss. To avoid this problem, the impedance at the input terminal 14 is predetermined so that the phase of the reflected portion of the input signal is at 180° with respect to that of the output signal at the center frequency of injection-type locked oscillation. By this arrangement, the input signal and the output signal at the input terminal 14 tend to cancel each other. There is a certain input signal level at which the reflected portion of the input signal and output signal completely cancel each other. When the input signal is at this level, no output signal appears at the input terminal 14, and losses on the input and output signals at the input terminal 14, i.e., the input terminal of the injection type locked amplifier device, are eliminated. Furthermore, because the output signal of the amplifier is derived from the output terminal 8, it is possible to impedance match the output terminal 8 by means of adjusting screws 5, 6 and 7, without affecting the input terminal 14. This separation of the terminals also makes it possible to dispense with the circulator. Therefore, the output signal can be taken out without causing insertion losses on the input signal and the output signal of the oscillator 15.

Another embodiment of the oscillator using a Gunn diode is constituted of a T-shaped waveguide as shown in FIG. 3. The components shown therein which correspond to those in FIGS. 1 and 2 are indicated by the identical reference numerals.

The oscillation frequency of oscillator 17 depends substantially on the distance from the Gunn diode 1 to the short-circuit face 4 of the waveguide 2. The impedance matching at the output terminal 8 is achieved by adjusting screws 5, 6 and 7.

As in the example of FIG. 2, a coupling window 13 is disposed in the short-circuit face 16 to form input terminal 14. The operation of this embodiment is essentially the same as that of the embodiment in FIG. 2.

According to another aspect of this invention, it is possible to obtain an output two or more times as large as the output of one of the injection-type frequency-locked amplifier with two or more amplifiers coupled in tandem.

In the foregoing embodiments of the invention, a Gunn diode is used as the oscillator element. In its place, an IMPATT diode, a transistor or any other active element may be used.

The principle of this invention is applicable not only to a waveguide but to any other circuit construction. For example, a transistor oscillator using a coaxial type (or re-entrant) cavity as shown in FIG. 4 may be used.

Impedance matching at the input terminal is determined by using a window disposed in the short-circuit face as described above. Alternately, a combination of a window and adjusting screws, or adjusting screws alone may be used.

While a few specific embodiments of the invention, an particular modifications thereof, have been illustrated and described in detail, it is to be understood that the invention is not limited thereto or thereby.

What is claimed is:

1. An injection-type frequency--locked amplifier comprising:

an oscillator, frequency locked to an injection input signal, an oscillator output terminal and an oscillator input terminal separate from said output terminal, the input impedance of said input terminal seen looking into said oscillator being at a value such that a portion of said injection input signal is reflected at said input terminal, whereby the reflected input signal cancels the output signal appearing at the input terminal.

2. The injection-type frequency-locked amplifier of claim 1 further comprising means for impedance matching said output terminal.

3. The injection-type frequency-locked amplifier of claim 2 wherein said oscillator comprises a waveguide and an oscillator element disposed in said waveguide, said means for impedance matching the output terminal comprising adjusting screws mounted on the waveguide.

4. The injection-type frequency-locked amplifier of claim 3 wherein said waveguide is of a longitudinal tubular structure said input and output terminals being formed respectively at the opposite ends of said tubular structure, said input terminal including a coupling window for determining the input impedance of the input terminal.

5. The injection-type frequency-locked amplifier of claim 4 further including additional adjusting screws for controlling the input impedance of the input terminal.

6. The injection-type frequency-locked amplifier of Claim 3 wherein said oscillator element is a Gunn diode.

7. The injection-type frequency-locked amplifier of Claim 3 wherein said waveguide is of T-shape construction, said oscillator element being disposed in the leg of the T-shape, said input and output terminals being disposed respectively at opposite ends of the top portion of said T-shape, said input terminal including a coupling window for determining the input impedance of the input terminal.

8. The injection-type frequency-locked amplifier of Claim 7 wherein said oscillator element is a Gunn diode.

9. The injection-type frequency-locked amplifier of Claim 2 further including another oscillator frequency locked to another injection input signal derived from said oscillator another oscillator output terminal and another oscillator input terminal separate from said another output terminal and coupled to the oscillator output terminal, the input impedance of said another input terminal seen looking into said another oscillator being at a value such that a portion of said another injection input signal is reflected at said another input terminal.

10. The injection-type oscillator of claim 1 wherein said oscillator comprises a transistor oscillator including a coaxial type cavity.

11. The injection-type frequency-locked amplifier of claim 3 wherein said oscillator element is an IMPATT diode.

12. The injection-type frequency-locked amplifier of claim 7 wherein said oscillator element is an IMPATT diode.

* * * * *